US012707872B2

(12) United States Patent
Lee et al.

(10) Patent No.: US 12,707,872 B2
(45) Date of Patent: Aug. 11, 2026

(54) DISPLAY DEVICE HAVING LIGHT CONTROL LAYER THAT LIMITS VIEWING ANGLE AND MANUFACTURING METHOD THEREOF

(71) Applicant: Samsung Display Co., LTD., Yongin-si (KR)

(72) Inventors: Jae Hun Lee, Yongin-si (KR); Kab Jong Seo, Yongin-si (KR); Jun Ho Sim, Yongin-si (KR); Yang-Ho Jung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 372 days.

(21) Appl. No.: 18/326,116

(22) Filed: May 31, 2023

(65) Prior Publication Data

US 2024/0138243 A1 Apr. 25, 2024
US 2024/0237501 A9 Jul. 11, 2024

(30) Foreign Application Priority Data

Oct. 24, 2022 (KR) ........................ 10-2022-0137369

(51) Int. Cl.

| | |
|---|---|
| ***H10K 59/80*** | (2023.01) |
| ***H10K 59/122*** | (2023.01) |
| ***H10K 71/16*** | (2023.01) |
| ***H10K 71/20*** | (2023.01) |

(52) U.S. Cl.
CPC ....... *H10K 59/8792* (2023.02); *H10K 59/122* (2023.02); *H10K 71/166* (2023.02); *H10K 71/231* (2023.02)

(58) Field of Classification Search
None
See application file for complete search history.

(56) References Cited

U.S. PATENT DOCUMENTS

| | | | | |
|---|---|---|---|---|
| 2010/0271721 | A1 | 10/2010 | Gaides et al. | |
| 2021/0074770 | A1* | 3/2021 | Choe | G02B 5/206 |
| 2021/0217831 | A1* | 7/2021 | Jung | H10K 59/8792 |
| 2021/0280569 | A1 | 9/2021 | You et al. | |
| 2022/0336781 | A1* | 10/2022 | Hong | H10K 59/40 |
| 2024/0057459 | A1 | 2/2024 | Jung et al. | |
| 2024/0122048 | A1* | 4/2024 | Seo | H10K 59/8792 |

(Continued)

FOREIGN PATENT DOCUMENTS

| | | |
|---|---|---|
| CN | 114333567 | 4/2022 |
| KR | 10-2002-0037443 | 5/2002 |
| KR | 10-2014-0133673 | 11/2014 |

(Continued)

*Primary Examiner* — Daniel Whalen
(74) *Attorney, Agent, or Firm* — F. CHAU & ASSOCIATES, LLC

(57) ABSTRACT

A display device according to an embodiment includes a light-emitting device disposed on a substrate and including an emission layer, and a light control layer disposed on the light-emitting device. The light control layer includes a plurality of light blocking patterns extending in a first direction and spaced in a second direction intersecting the first direction, and a transmission layer disposed among the plurality of light blocking patterns and including a transparent organic layer and a transparent inorganic layer that are alternately stacked on each other.

12 Claims, 18 Drawing Sheets

(56) References Cited

U.S. PATENT DOCUMENTS

2024/0234639 A9* 7/2024 Sim ........................ B60K 35/22

FOREIGN PATENT DOCUMENTS

| | | |
|---|---|---|
| KR | 10-2018-0084333 | 7/2018 |
| KR | 10-2020-0063591 | 6/2020 |
| KR | 10-2021-0092351 | 7/2021 |
| KR | 10-2021-0113525 A | 9/2021 |
| KR | 10-2022-0004262 | 1/2022 |
| KR | 10-2024-0023344 | 2/2024 |

* cited by examiner (a)

(b)

DISPLAY DEVICE HAVING LIGHT CONTROL LAYER THAT LIMITS VIEWING ANGLE AND MANUFACTURING METHOD THEREOF

CROSS-REFERENCE TO RELATED APPLICATION(S)

This application claims priority to and benefits of Korean Patent Application No. 10-2022-0137369 under 35 U.S.C. § 119, filed in the Korean Intellectual Property Office on Oct. 24, 2022, the entire contents of which are incorporated herein by reference.

BACKGROUND

1. Technical Field

The disclosure relates to a display device including a light control layer and a manufacturing method.

2. Description of the Related Art

Display devices display images, and may be a liquid crystal display (LCD), an organic light emitting diode (OLED) display, a quantum dot light emitting diode (QLED) display, or a micro LED display.

Display devices may be used in electronic devices such as smartphones, mobile phones, tablet PCs, monitors, televisions, multimedia players, or video game consoles. Further, display devices may be applied to various additional fields. For example, research relating to the use of display devices in vehicles using organic light emitting elements is being conducted.

A light control film (LCF) for controlling reflected images by blocking light emitted by a display device toward a front glass of a vehicle may be provided, for the purpose of safety of a driver.

The above information disclosed in this Background section is only for enhancement of understanding of the background of the disclosure, and therefore it may contain information that does not form the prior art that is already known in this country to a person of ordinary skill in the art.

SUMMARY

The disclosure has been made in an effort to provide a display device including a light control layer for reducing reflection from side walls of a light blocking portion.

The disclosure has been made in another effort to control a lateral viewing angle to prevent exposure of a user privacy.

The disclosure has been made in another effort to prevent light emitted by a display device of a vehicle from being reflected from a front glass of the vehicle and hindering sight of a driver.

An embodiment of the disclosure provides a display device that may include a light-emitting device disposed on a substrate and including an emission layer, and a light control layer disposed on the light-emitting device. The light control layer may include a plurality of light blocking patterns extending in a first direction and spaced in a second direction intersecting the first direction, and a transmission layer disposed among the plurality of light blocking patterns and including a transparent organic layer and a transparent inorganic layer that are alternately stacked on each other.

The transmission layer may form protrusions and depressions including a concave portion and a convex portion on a side extending to the light blocking pattern.

The transparent organic layer may extend to the light blocking pattern at the concave portion of the transmission layer, and the transparent inorganic layer may extend to the light blocking pattern at the convex portion of the transmission layer.

A width of the transparent organic layer may be different from a width of the transparent inorganic layer.

The width of the transparent organic layer may be less than the width of the transparent inorganic layer.

The transparent organic layer and the transparent inorganic layer may be alternately stacked on each other at least twice.

Another embodiment of the disclosure provides a display device that may include a light-emitting device disposed on a substrate and including an emission layer, a pixel defining layer having an opening corresponding to the emission layer, and a plurality of light blocking patterns disposed on the pixel defining layer and the emission layer and that extend in a first direction. The plurality of light blocking patterns include an organic light blocking layer and an inorganic light blocking layer alternately stacked on each other.

The display device may further include a transparent organic layer disposed among the plurality of light blocking patterns.

The light blocking pattern may form protrusions and depressions including a concave portion and a convex portion on a lateral side.

The organic light blocking layer may extend to the transparent organic layer at the concave portion, and the inorganic light blocking layer may extend to the transparent organic layer at the convex portion.

A width of the organic light blocking layer may be different from the inorganic light blocking layer.

The width of the organic light blocking layer may be less than the width of the inorganic light blocking layer.

The organic light blocking layer and the inorganic light blocking layer may be alternately stacked on each other at least twice.

The transparent organic layer may be disposed on the light blocking pattern and planarize the light blocking pattern.

Another embodiment of the disclosure provides a method for manufacturing a display device. The method may include forming a light-emitting device on a substrate, forming an encapsulation layer that covers the light-emitting device, forming a transparent material layer by alternately stacking a transparent organic layer and a transparent inorganic layer on each other on the encapsulation layer, forming a hard mask pattern on the transparent material layer, etching the transparent material layer and forming a transmission pattern with the hard mask, and applying a light blocking material for filling an opening between the transmission pattern.

The transmission pattern may include protrusions and depressions on a surface disposed toward the opening.

The transparent organic layer and the transparent inorganic layer may have different widths.

Another embodiment of the disclosure provides a method for manufacturing a display device. The method may include forming a light-emitting device on a substrate, forming an encapsulation layer that covers the light-emitting device, forming a light blocking pattern layer by alternately stacking an organic light blocking layer and an inorganic light blocking layer on each other on the encapsulation layer, forming a hard mask pattern on the light blocking pattern layer, completing a light blocking pattern including an opening by etching the light blocking pattern layer with the hard mask, and applying a transparent organic layer for filling an opening between the light blocking patterns.

The light blocking pattern may include protrusions and depressions on a surface disposed toward the opening.

The organic light blocking layer and the inorganic light blocking layer may have different widths.

According to the embodiments, the display device including a light control layer for reducing reflection from the side wall of the light blocking pattern and the manufacturing method may be provided.

The embodiments may form a structure of protrusions and depressions on the side wall of the light blocking pattern to control extraction of light caused by the reflection from the side wall.

According to the embodiments, the light emitted by the display device for a vehicle is prevented from being provided to the front glass of the vehicle so that the light reflected at the front glass of the vehicle may not hinder the view of the driver.

Further, the display device including a light control layer for protecting user privacy by controlling the lateral viewing angle may be provided.

DETAILED DESCRIPTION OF THE EMBODIMENTS

Figure 1:
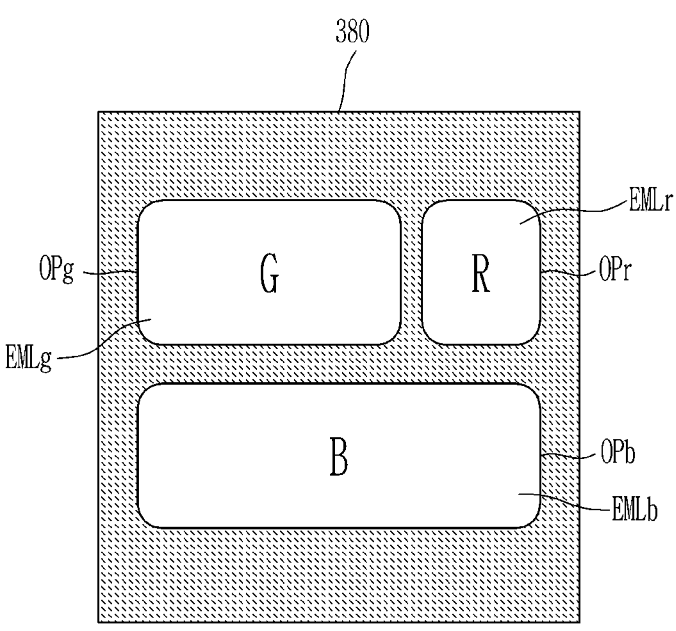
FIG. 1 is a schematic top plan view of a pixel of a display device according to an embodiment.
Figure 1:
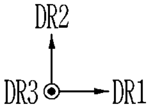

The disclosure will be described more fully hereinafter with reference to the accompanying drawings, in which embodiments of the disclosure are shown. As those skilled in the art would realize, the described embodiments may be modified in various different ways, all without departing from the spirit or scope of the disclosure.

Parts that are irrelevant to the description will be omitted to clearly describe the disclosure, and the same elements will be designated by the same reference numerals throughout the specification.

In the drawings, the thickness of layers, films, panels, regions, etc., may be exaggerated for clarity and ease of description.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that when an element such as a layer, film, region, or substrate is referred to as being "on" another element, it can be directly on the other element or intervening elements may also be present. In contrast, when an element is referred to as being "directly on" another element, there may be no intervening elements present. The word "on" or "above" means disposed on or below the object portion, and does not necessarily mean disposed "on" or "above" the upper side of the object portion based on a gravitational direction.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing a target portion from the top, and the phrase "in a cross-sectional view" means viewing a cross-section formed by perpendicularly cutting a target portion from the side.

Throughout the specification, when it is described that a part is "connected" to another part, the part may be directly connected to the other element, may be connected to the other part through a third part. The connection may be physical and/or electrical. Further, parts may be referred to by different titles depending on positions or functions, but respective portions that are substantially integrated into one body may be connected to each other.

When the parts such as wires, layers, films, regions, plates, or constituent elements are described to extend in the "first direction or the second direction", this not only signifies a straight-line shape running straight in a corresponding direction, but also includes a structure generally extending in the first direction or the second direction, a structure bent on a predetermined or selected portion, a zigzag-shaped structure, or a structure including a curved structure and extending.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A display device including a light control layer according to an embodiment will now be described with reference to FIG. 1 to FIG. 4.

Figure 2:
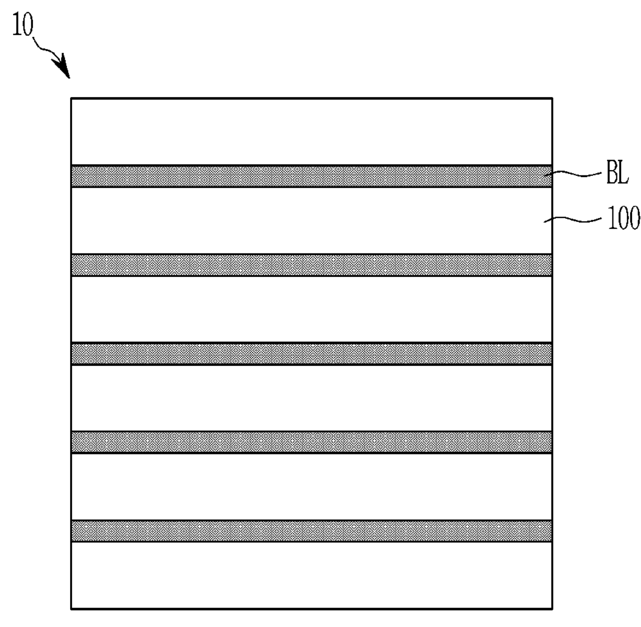
FIG. 2 is a schematic top plan view of a light control layer provided on a display device according to an embodiment.
Figure 3:
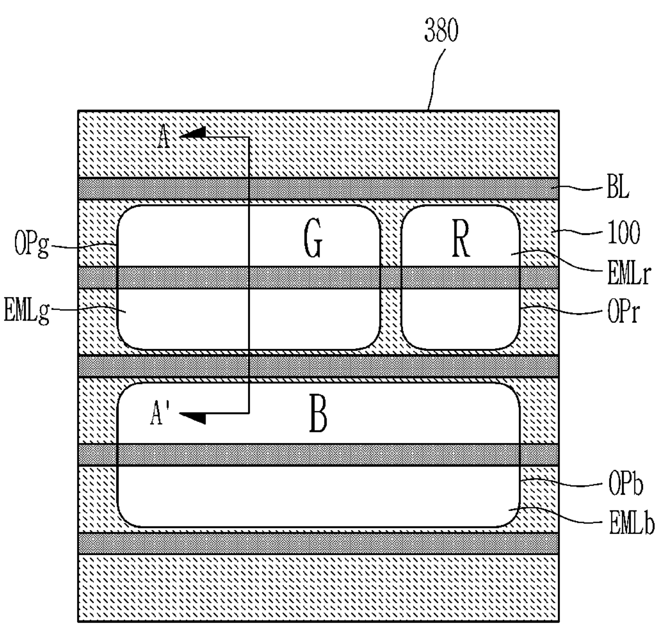
FIG. 3 is a schematic view of a planar structure of a display device of FIG. 1 and FIG. 2.
Figure 3:
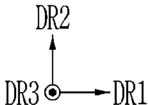
Figure 4:
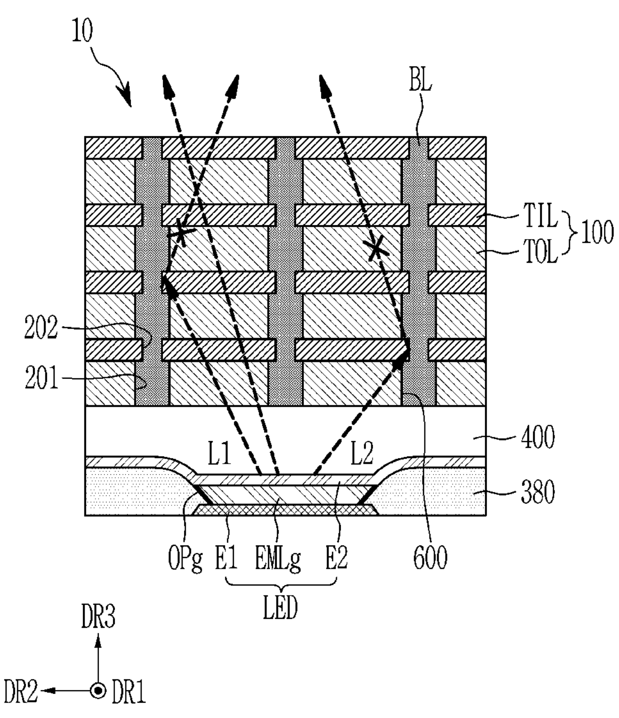
FIG. 4 is a schematic cross-sectional view with respect to line A-A' of FIG. 3 according to an embodiment.

FIG. 1 is a schematic top plan view of a pixel of a display device according to an embodiment. FIG. 2 is a schematic top plan view of a light control layer provided on a display device according to an embodiment. FIG. 3 is a schematic view of a planar structure of a display device of FIG. 1 and FIG. 2. FIG. 4 is a schematic cross-sectional view with respect to line A-A' of FIG. 3 according to an embodiment.

FIG. 1 shows three adjacent light-emitting devices displaying different colors of red R, green G, and blue B, and the respective light-emitting devices may include emission layers EMLr, EMLg, and EMLb.

The respective emission layers EMLr, EMLg, and EMLb represent light emitting portions of the light-emitting devices, and may be partitioned by a pixel defining layer 380. The respective emission layers EMLr, EMLg, and EMLb may overlap openings OPr, OPg, and OPb formed in the pixel defining layer 380. The respective emission layers EMLr, EMLg, and EMLb may be disposed in the respective openings OPr, OPg, and OPb of the pixel defining layer 380, and may include portions disposed outside the respective openings OPr, OPg, and OPb. Although not shown in FIG. 1, a first electrode may be disposed below the emission layers EMLr, EMLg, and EMLb, and a second electrode and an encapsulation layer may be disposed above the pixel defining layer 380 and the emission layers EMLr, EMLg, and EMLb. An anode, one of the emission layers EMLr, EMLg, and EMLb, and a cathode may configure a light-emitting device. A detailed stacking structure of the light-emitting device will be described more herein.

FIG. 2 shows a planar structure of a light control layer 10 according to an embodiment.

The light control layer 10 may include multiple light blocking patterns BL. The light blocking patterns BL may include a light blocking material and may control a viewing angle of a user viewing image light.

The light blocking patterns BL may extend in a first direction DR1, and may be disposed at regular intervals in a second direction DR2 traversing (intersecting) the first direction.

Depending on embodiments, disposed intervals of the light blocking pattern BL may not be regular.

The light blocking patterns BL may include a light blocking material. For example, a dark colored pigment such as a black pigment or a gray pigment, a dark colored dye, a metal such as aluminum or silver, a metal oxide, or a dark colored polymer may be used as the light blocking material. The metal oxide may, for example, include $MoTaO_x$, $AlO_x$, $CrO_x$, $CuO_x$, $MoO_x$, $Ti_x$, $AlNdO_x$, $CuMoO_x$, and/or $MoTi_x$.

A transmission layer 100 may be disposed in a region in which no light blocking patterns BL are formed. The light control layer 10 may have a structure in which a light blocking material is filled in the opening 600 (refer to FIG. 4) formed in the transmission layer 100 and the light blocking pattern BL is formed. The transmission layer 100 may transmit the light input by the light-emitting device and may emit it to the outside, and may include a structure in which a transparent organic layer TOL and a transparent inorganic layer TIL are alternately stacked on each other.

The light control layer 10 may include multiple light blocking patterns BL extending in the first direction DR1 in a plan view and disposed at regular intervals in a second direction DR2 traversing the first direction, and a transmission layer 100 disposed among the light blocking patterns BL and extending in the first direction DR1, and may be disposed at an upper portion of the display panel including a light-emitting device.

FIG. 3 shows a planar structure in which a light control layer as shown in FIG. 2 is disposed on an upper portion of the light-emitting device having an arrangement shown in FIG. 1 according to an embodiment.

FIG. 3 shows a structure in which a light blocking pattern BL may traverse between a light-emitting device according to an embodiment, and a light blocking pattern BL may be disposed on respective sides of the light-emitting device, that is, between the adjacent light-emitting devices.

The respective emission layers EMLr, EMLg, and EMLb and/or the openings OPr, OPg, and OPb of the pixel defining layer 380 may overlap a light blocking pattern BL, and a light blocking pattern BL may be disposed in a center of the respective emission layers EMLr, EMLg, and EMLb and/or the openings OPr, OPg, and OPb of the pixel defining layer 380. The respective emission layers EMLr, EMLg, and EMLb and/or the openings OPr, OPg, and OPb of the pixel defining layer 380 may have a pair of light blocking patterns BL that do not overlap the same but are disposed near the same, and the pair of light blocking patterns BL may overlap the pixel defining layer 380.

FIG. 4 shows a cross-sectional view with respect to a line A-A' of FIG. 3.

Referring to FIG. 4, an encapsulation layer 400 may be disposed below the transmission layer 100, and the light-emitting device LED may be disposed at the lower portion of the encapsulation layer 400. The encapsulation layer 400 may include at least one inorganic film and at least one organic film, and depending on embodiments, it may have a triple-layered structure including a lower inorganic encapsulation film, an organic encapsulation film, and an upper inorganic encapsulation film. The encapsulation layer 400 may protect the emission layer EMLg from moisture or oxygen that may be input from the outside. Depending on embodiments, the encapsulation layer 400 may have a structure in which an inorganic layer and an organic layer are sequentially further stacked on each other.

The light-emitting device LED may include a first electrode E1, an emission layer EMLg, and a second electrode E2. The pixel defining layer 380 including the opening OPg for exposing the first electrode E1 and covering at least part of the first electrode E1 may be disposed on the first electrode E1. The pixel defining layer 380 may be a black pixel defining layer made of a black organic material and preventing light applied from the outside from being reflected to the outside. Depending on embodiments, the pixel defining layer 380 may include a negative-type black organic material, and may include a black color pigment.

An emission layer EMLg may be disposed on the first electrode E1 exposed by the pixel defining layer 380. A second electrode E2 may be disposed on the pixel defining layer 380 and emission layer EMLg.

Regarding a cross-sectional structure given with FIG. 4, a structure disposed at the lower portion of the first electrode E1 is omitted, and a structure of the lower portion of the first electrode E1 will be described later.

The light control layer 10 may include multiple light blocking patterns BL and a transmission layer 100 on the encapsulation layer 400. The transmission layer 100 may have a structure in which the transparent organic layer TOL and the transparent inorganic layer TIL are alternately stacked on each other multiple times. The transparent organic layer TOL may be thicker than the transparent inorganic layer TIL. For example, a ratio of thicknesses of the transparent organic layer TOL and the transparent inorganic layer TIL may be 9:1 or 8:2.

Depending on embodiments, a touch insulating layer and a touch sensor layer including multiple touch electrodes may be disposed between the transmission layer 100 and the encapsulation layer 400 so as to sense touches.

The transparent organic layer TOL may include a transparent resin. For example, it may include an organic material such as a general-purpose polymer including poly(methyl methacrylate) (PMMA) and polystyrene (PS), a polymer derivative having a phenol-based group, an acryl-based polymer, an imide-based polymer such as a polyimide, a siloxane-based polymer, and/or a cardo-based polymer.

The transparent inorganic layer TIL may be made by stacking inorganic materials such as a silicon oxide ($SiO_x$) or a silicon nitride ($SiN_x$), or may be made of transparent conductive oxide (TCO) such as an ITO or an IZO depending on embodiments.

The transparent organic layer TOL and the transparent inorganic layer TIL may be formed of material with different etch rates in a photolithography process. When the process is finished, widths of the transparent organic layer TOL and the transparent inorganic layer TIL may be different according to a difference of etching degrees between the transparent organic layer TOL and the transparent inorganic layer TIL.

For example, as the transparent organic layer TOL may have a greater etch rate than the transparent inorganic layer TIL and a greater amount thereof may be etched per unit time, the width of the transparent organic layer TOL may be less than the width of the transparent inorganic layer TIL. Hence, the transmission layer 100 may form protrusions and depressions including a concave portion 201 generated by etching the transparent organic layer TOL and a convex portion 202 generated by etching the transparent inorganic layer TIL on the side wall configuring the opening 600 formed by an etching process. Regarding the transmission layer 100, the concave portion 201 may have a width less than the convex portion 202 in a cross-sectional view. The convex portion 202 may have a greater width than the concave portion 201 in a cross-sectional view.

A light blocking pattern BL may be disposed between the transmission layer 100. The light blocking pattern BL may include a light blocking material. A dark colored pigment such as a black pigment or a gray pigment, a dark colored dye, a metal such as aluminum or silver, a metal oxide, and/or a dark colored polymer may be used as the light blocking material. The metal oxide may, for example, include $MoTaO_x$, $AlO_x$, $CrO_x$, $CuO_x$, $MOO_x$, $Ti_x$, $AlNdO_x$, $CuMoO_x$, and/or $MoTi_x$.

The light blocking pattern BL may extend in the first direction DR1, and may be disposed in the second direction DR2 traversing the first direction DR2. The light blocking pattern BL may be made by filling the opening 600 between the transmission layer 100. The transmission layer 100 may form protrusions and depressions on the side wall provided toward the opening 600, and the light blocking pattern BL may include protrusions and depressions on the side wall as it may be formed corresponding to a shape of the opening 600. For example, the light blocking pattern BL may form protrusions and depressions including a convex portion that corresponds to the concave portion 201 of the transmission layer 100 in the third direction DR3 that is a thickness direction of the substrate and a concave portion that corresponds to the convex portion 202 of the transmission layer 100 on the side wall contacting the transmission layer 100.

For example, a portion on which the light blocking pattern BL contacts the transparent organic layer TOL may be the convex portion of the light blocking pattern BL, and a portion on which the light blocking pattern BL contacts the transparent inorganic layer TIL may be the concave portion of the light blocking pattern BL. The concave portion of the light blocking pattern BL may have a width less than the convex portion in a cross-sectional view. The convex portion of the light blocking pattern BL may have a greater width than the concave portion in a cross-sectional view.

The light control layer 10 may include the light blocking pattern BL including protrusions and depressions on the side wall so reflectance on the side wall of the display device may be reduced.

A principle of transmitting and blocking light with respect to the green emission layer EMLg will now be described with reference to FIG. 4. In case that the light-emitting device emits light, it signifies that the emission layer EMLg emits light, and the light emitted by the emission layer EMLg may be discharged in many directions. The light discharged in many directions may be transmitted within a predetermined or selected angle because of the light blocking pattern BL disposed on the upper portion of the emission layer EMLg.

As the light blocking pattern BL of the light control layer 10 forms the protrusions and depressions including concave portions and convex portions on the side wall, it may efficiently control the light L1 and L2 that is partly not absorbed but is reflected from the side wall of the light blocking pattern BL. For example, the light L1 and L2 emitted by the emission layer EMLg and having progressed to the concave portion of the light blocking pattern BL may not be absorbed but may be reflected from the side wall, and it may be blocked by the convex portion of the light blocking pattern BL and may not be transmitted to the outside. As a result, the side-wall reflectance of the emissive display device may be reduced and extraction of light to the outside may be controlled. The side-wall reflectance will be described in detail according to a comparative example with reference to FIG. 15.

A method for manufacturing a light control layer 10 according to an embodiment will now be described with reference to FIG. 5 to FIG. 8. FIG. 5 to FIG. 8 are sequential schematic views of a method for manufacturing a light control layer 10 of a display device according to an embodiment.

FIG. 5 to FIG. 8 show some layers disposed at a lower portion, showing an upper inorganic encapsulation film 403 included in an encapsulation layer.

Figure 5:
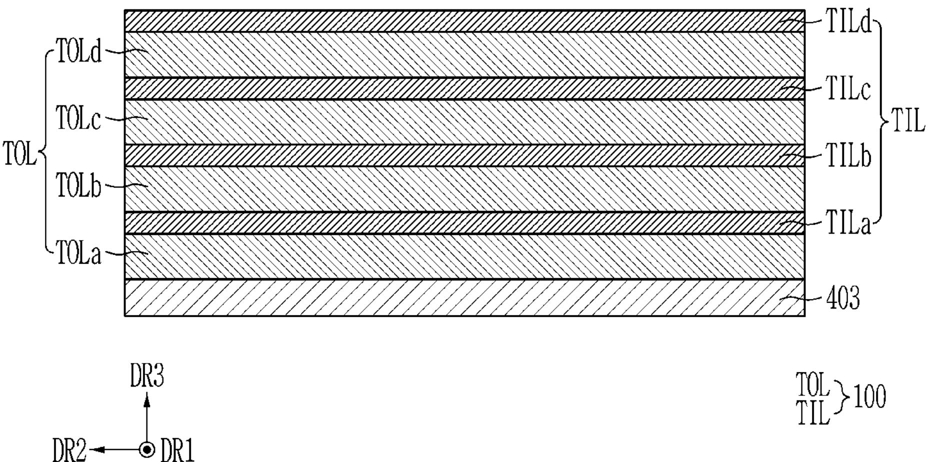
FIG. 5 to FIG. 8 are sequential schematic views of a method for manufacturing a light control layer according to an embodiment given with FIG. 4.

Referring to FIG. 5, the transparent organic layer TOL and the transparent inorganic layer TIL may be alternately stacked on each other on the upper inorganic encapsulation film 403 to form a transparent material layer. The transparent organic layer TOL and the transparent inorganic layer TIL may be repeatedly stacked on each other multiple times. For example, they may be repeatedly stacked on each other four times.

In detail, a first transparent organic layer TOLa may be formed on the upper inorganic encapsulation film 403. A first transparent inorganic layer TILa may be formed on the first transparent organic layer TOLa. Sequentially, a second transparent organic layer TOLb, a second transparent inorganic layer TILb, a third transparent organic layer TOLc, a third transparent inorganic layer TILc, a fourth transparent organic layer TOLd, and a fourth transparent inorganic layer TILd may be formed.

The transparent organic layer TOL may include a transparent resin. For example, it may include an organic material such as a general-purpose polymer including poly(methyl methacrylate) (PMMA) and polystyrene (PS), a polymer derivative having a phenol-based group, an acryl-based polymer, an imide-based polymer such as a polyimide, a siloxane-based polymer, and/or a cardo-based polymer.

The transparent inorganic layer TIL may be formed by stacking inorganic materials such as a silicon oxide (SiOx) or a silicon nitride (SiNx) or may be formed of a transparent conductive oxide (TCO) such as an ITO or an IZO depending on embodiments.

The transparent organic layer TOL and the transparent inorganic layer TIL may be formed of material with different etch rates in a photolithography process. Accordingly, in a following etching process, the etching degrees of the transparent organic layer TOL and the transparent inorganic layer TIL may be different from each other so the widths of the transparent organic layer TOL and the transparent inorganic layer TIL may be different when the process ends.

Figure 6:
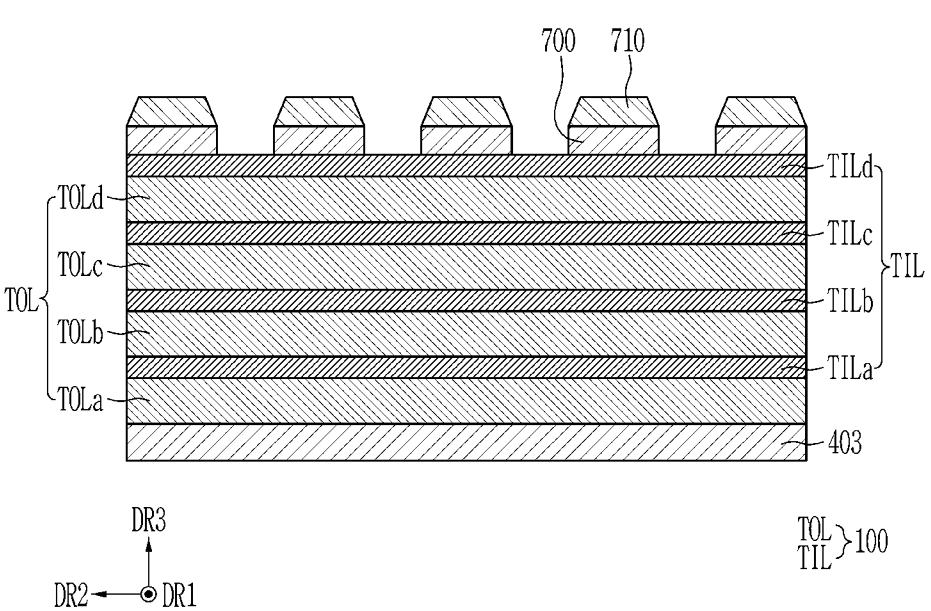

Referring to FIG. 6, to pattern the transparent material layer generated by alternately stacking the transparent organic layer TOL and the transparent inorganic layer TIL, a pattern of a hard mask 700 may be formed on the transparent material layer. The hard mask 700 may be made of a metal such as aluminum (Al) or molybdenum (Mo), or their alloys. A mask may be used, an exposure and a development may be performed thereto to form a photoresist pattern 710 on an upper portion of the hard mask 700, and an etching may be performed to generate a pattern of the hard mask 700.

Figure 7:
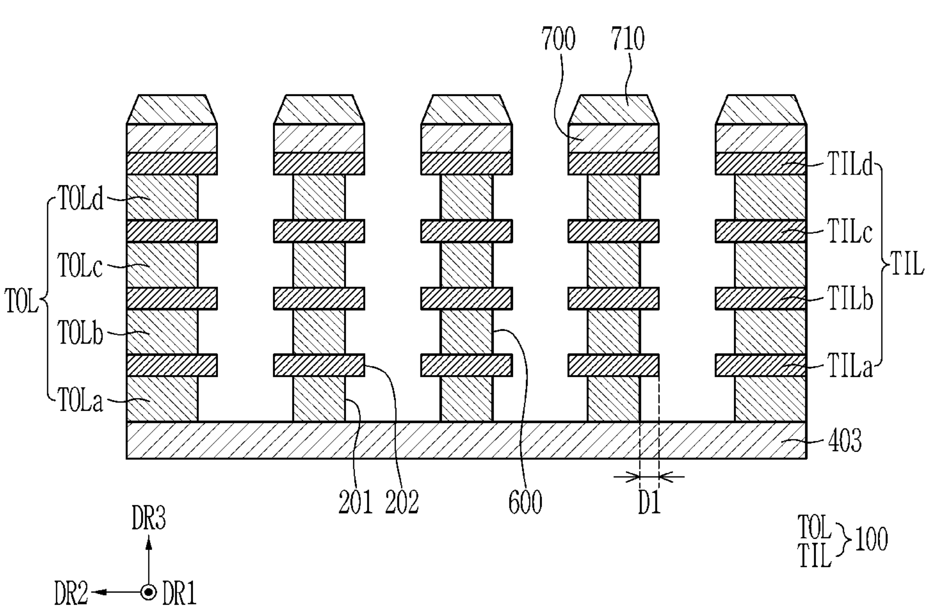

As shown in FIG. 7, the transparent organic layers TOLa, TOLb, TOLc, and TOLd and the transparent inorganic layers TILa, TILb, TILc, and TILd alternately stacked on each other multiple times with the hard mask 700 as a mask may be simultaneously etched to form the pattern of the transmission layer 100 including an opening 600. Here, the etching process may be a dry etching process.

The transparent organic layers TOL and the transparent inorganic layers TIL may be materials with different etch rates, and they may be etched with different etching degrees, for example, the transparent organic layer TOL may be further etched than the transparent inorganic layer TIL in the same etching process.

In detail, in the direction that is parallel to the second direction DR2 in parallel to the substrate, the transparent organic layer TOL may be further etched than the transparent inorganic layer TIL by a predetermined or selected distance D1 so the concave portion 201 may be formed in the surface of the transparent organic layer TOL forming the opening 600. Further, the transparent inorganic layer TIL may be relatively less etched than the transparent organic layer TOL to form the convex portion 202 on the surface forming the opening 600. In a cross-sectional view, the width of the concave portion 201 may be less than the width of the convex portion 202, and the width of the convex portion 202 may be greater than the width of the concave portion 201.

The surfaces of the respective transparent organic layers TOLa, TOLb, TOLc, and TOLd exposed toward the opening 600 may be the surface of the concave portion 201. The surfaces of the respective transparent inorganic layers TILa, TILb, TILc, and TILd exposed toward the opening 600 may be the surface of the convex portion 202. Accordingly, the surface of the transmission layer 100 forming the opening 600 may form the structure of protrusions and depressions including the concave portions 201 and the convex portions 202.

Figure 8:
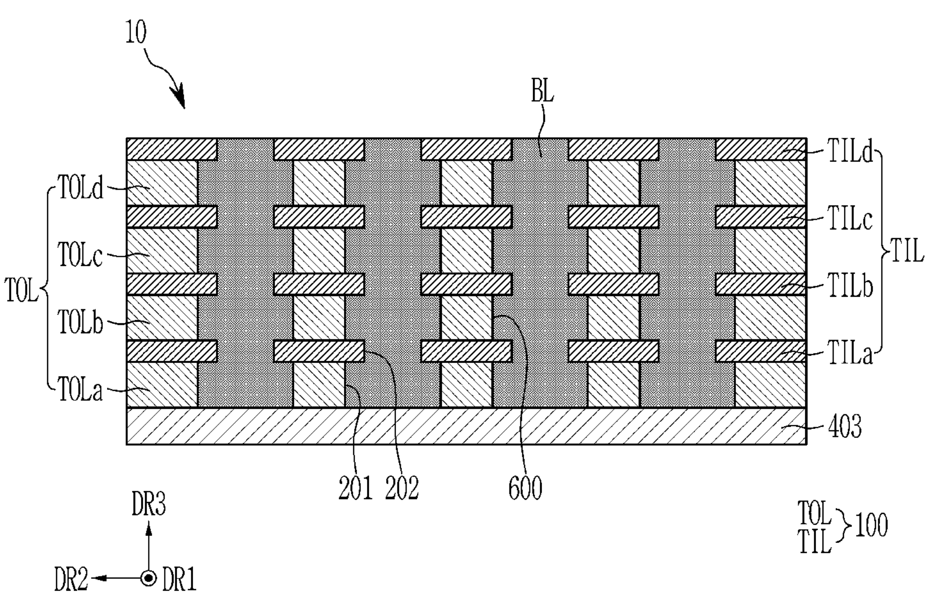

The hard mask 700 may be removed, and referring to FIG. 8, a light blocking material for filling the opening 600 between the pattern of the transmission layer 100 may be applied to an entire region. The light blocking material applied to an entire region may be provided into the opening 600 between the transmission layer 100 to form the light blocking pattern BL that corresponds to the shape of the opening 600 between the pattern of the transmission layer 100. For example, the side wall of the light blocking pattern BL contacting the transmission layer 100 may have a structure of protrusions and depressions including a convex portion that corresponds to the concave portion 201 on which a transparent organic layer TOL is etched and a concave portion that corresponds to the convex portion 202 on which a transparent inorganic layer TIL is etched.

A light blocking pattern BL including the structure of protrusions and depressions may be formed on the surface of the side wall by performing a planarization process such as a chemical mechanical polishing (CMP) process. As the light blocking pattern BL includes the structure of protrusions and depressions on the side wall, a blocking rate of the lateral side may be increased by controlling a reflection angle on the lateral side. Accordingly, reflectance of the lateral side of the light blocking pattern BL may be reduced.

Figure 9:
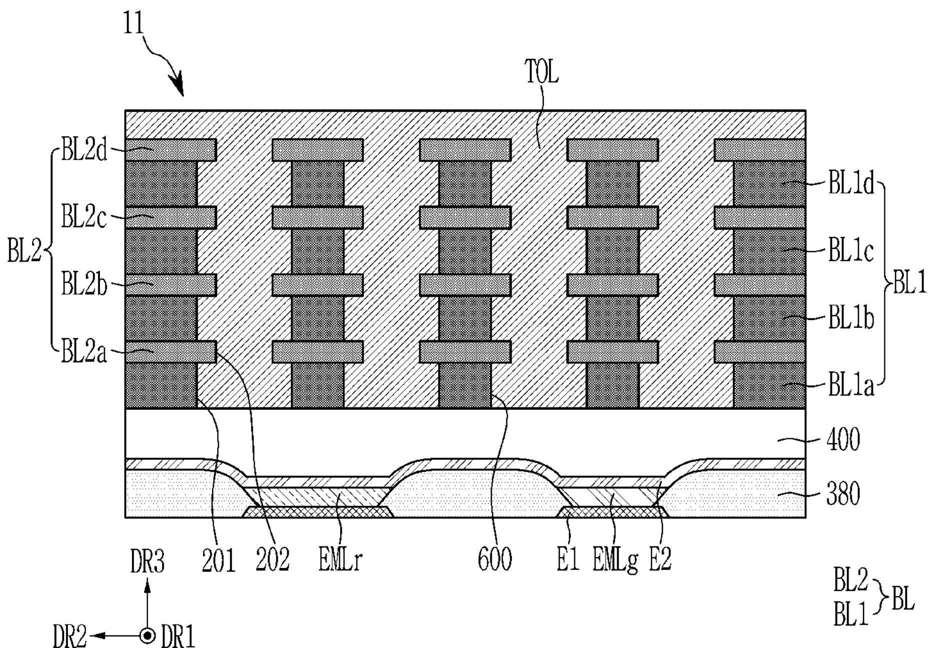
FIG. 9 is a schematic cross-sectional view of a light control layer in a display device according to an embodiment.

FIG. 9 is a schematic cross-sectional view of a light control layer 11 in a display device according to an embodiment.

Referring to FIG. 9, the light control layer 11 may include multiple light blocking patterns BL and a transparent organic layer TOL on the upper inorganic encapsulation film 403. The light blocking patterns BL may have a structure in which organic light blocking layers BL1*a*, BL1*b*, BL1*c*, and BL1*d* and inorganic light blocking layers BL2*a*, BL2*b*, BL2*c*, and BL2*d* are alternately stacked on each other.

The organic light blocking layers BL1 may include a light blocking organic material including a dark colored pigment such as a black pigment or a gray pigment, and a dark colored dye. The organic light blocking layer BL1 may be made of a same material as a black matrix or a black pixel defining layer used in the display device. For example, the organic light blocking layer BL1 may include a polyimide binder and a pigment that is a mixture of red, green, and blue, and may include a cardo binder resin and a mixture of a lactam black pigment and a blue pigment. The organic light blocking layer BL1 may include a carbon black.

The inorganic light blocking layer BL2 may include an opaque inorganic film such as a metal oxide. For example, it may include a metal oxide such as $MoTaO_x$, $AlO_x$, $CrO_x$, $CuO_x$, $MOO_x$, $Ti_x$, $AlNdO_x$, $CuMoO_x$, and/or $MoTi_x$. It may also include a low-reflectance metal. For example, it may include ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), silver (Ag), magnesium (Mg), gold (Au), copper (Cu), calcium (Ca), or combinations thereof.

The transparent organic layer TOL may be disposed among the light blocking patterns BL. The transparent organic layer TOL may be applied to an entire side of the substrate on which the light blocking patterns BL are formed to fill the opening 600 among the light blocking patterns BL and planarize the upper side of the light control layer 11.

The transparent organic layer TOL may include a transparent resin. For example, it may include an organic material such as a general-purpose polymer including poly(methyl methacrylate) (PMMA) and polystyrene (PS), a polymer derivative having a phenol-based group, an acryl-based polymer, an imide-based polymer such as a polyimide, a siloxane-based polymer, or a cardo-based polymer.

The organic light blocking layer BL1 and the inorganic light blocking layer BL2 may be made of materials with different etch rates in a photolithography process. When the etching process ends, the widths of the organic light blocking layer BL1 and the inorganic light blocking layer BL2 may be different because of the difference of etching degrees between the organic light blocking layer BL1 and the inorganic light blocking layer BL2. For example, the organic light blocking layer BL1 may have a greater etch rate than the inorganic light blocking layer BL2, and a greater amount thereof may be etched per unit time. Hence, the light blocking pattern BL may have the structure of protrusions and depressions including a concave portion 201 on which the organic light blocking layer BL1 is etched and a convex portion 202 on which the inorganic light blocking layer BL2 is etched on the side wall formed by the etching process. Regarding the light blocking pattern BL, the concave portion 201 may have a width less than the convex portion 202 in a cross-sectional view. The convex portion 202 may have a greater width than the concave portion 201 in a cross-sectional view.

A light-emitting device including an emission layer may be disposed at the lower portion of the encapsulation layer 400. A lower structure of the encapsulation layer 400 may be equivalent to the above-described embodiment so it will be omitted.

A method for manufacturing a light control layer 11 according to an embodiment will now be described with reference to FIG. 10 to FIG. 13. FIG. 10 to FIG. 13 are sequential schematic views of a method for manufacturing a light control layer 10 of a display device according to an embodiment.

FIG. 10 to FIG. 13 show some layers disposed at a lower portion, showing an upper inorganic encapsulation film 403 included in an encapsulation layer.

Figure 10:
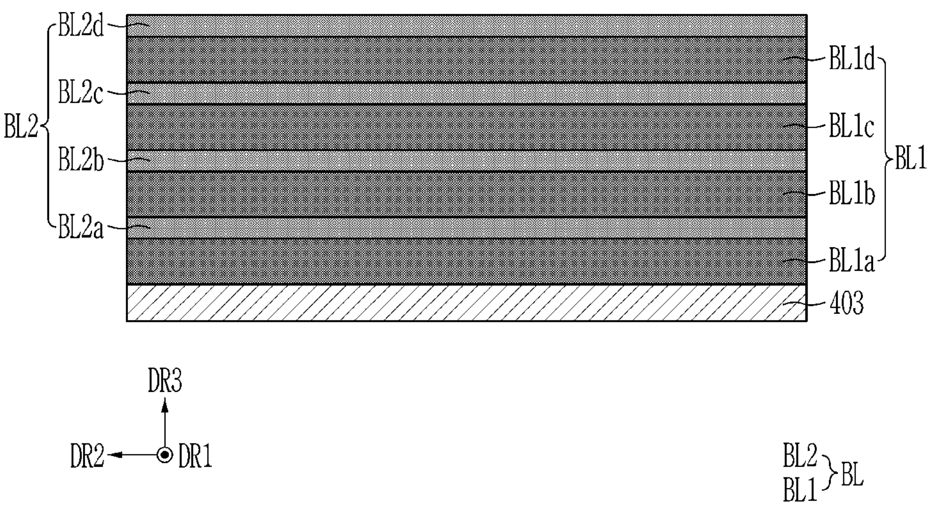
FIG. 10 to FIG. 13 are sequential schematic views of a method for manufacturing a light control layer according to an embodiment described with reference to FIG. 9.

Referring to FIG. 10, the organic light blocking layer BL1 and the inorganic light blocking layer BL2 may be alternately stacked on each other on the upper inorganic encapsulation film 403 to form a light blocking material layer. The organic light blocking layer BL1 and the inorganic light blocking layer BL2 may be repeatedly stacked on each other multiple times, for example, they may be repeatedly stacked on each other four times.

In detail, a first organic light blocking layer BL1*a* may be formed on the upper inorganic encapsulation film 403. A first inorganic light blocking layer BL2*a* may be formed on the first organic light blocking layer BL1*a*. Sequentially, a second organic light blocking layer BL1*b*, a second inorganic light blocking layer BL2*b*, a third organic light blocking layer BL1*c*, a third inorganic light blocking layer BL2*c*, a fourth organic light blocking layer BL1*d*, and a fourth inorganic light blocking layer BL2*d* may be formed.

The organic light blocking layer BL1 may be made of a light blocking material, and may be made of the same material as the black matrix or the black pixel defining layer used in the display device. The organic light blocking layer BL1 may include a dark colored pigment such as a black pigment or a gray pigment, and may include a light blocking organic material including a dark colored dye.

The inorganic light blocking layer BL2 may include an opaque inorganic film such as a metal oxide or a low-reflectance metal.

The organic light blocking layer BL1 and the inorganic light blocking layer BL2 may be formed of material with different etch rates in a photolithography process. Accordingly, in a following etching process, the etching degrees of the organic light blocking layer BL1 and the inorganic light blocking layer BL2 may be different from each other so the widths of the organic light blocking layer BL1 and the inorganic light blocking layer BL2 may be different when the process ends.

Figure 11:
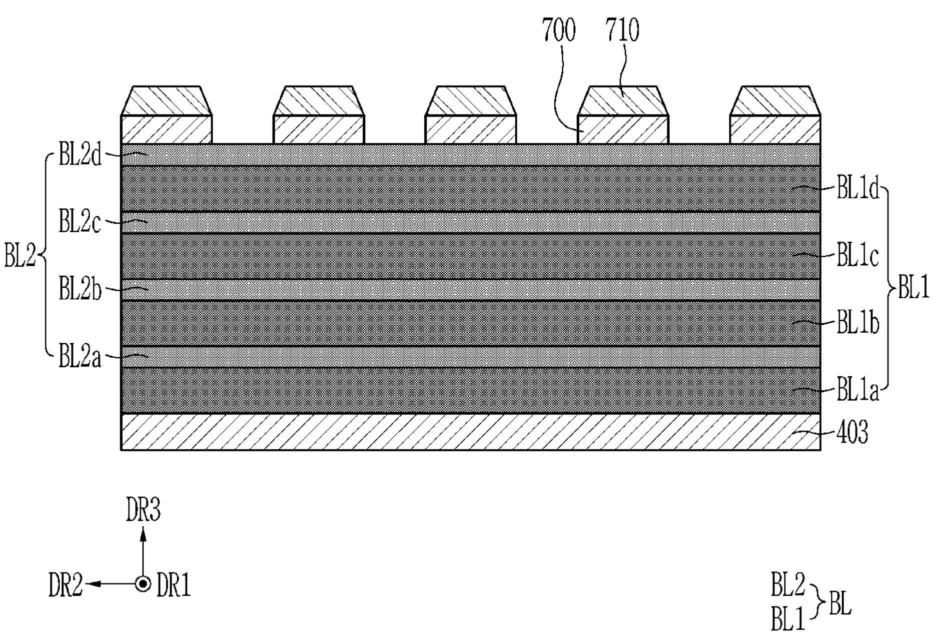

Referring to FIG. 11, to pattern the light blocking material layer generated by alternately stacking the organic light blocking layer BL1 and the inorganic light blocking layer BL2, a pattern of the hard mask 700 may be formed on the light blocking material layer. A mask may be used, an exposure and a development are performed thereto to form a photoresist pattern 710 on an upper portion of the hard mask 700, and an etching may be performed to generate a pattern of the hard mask 700.

Figure 12:
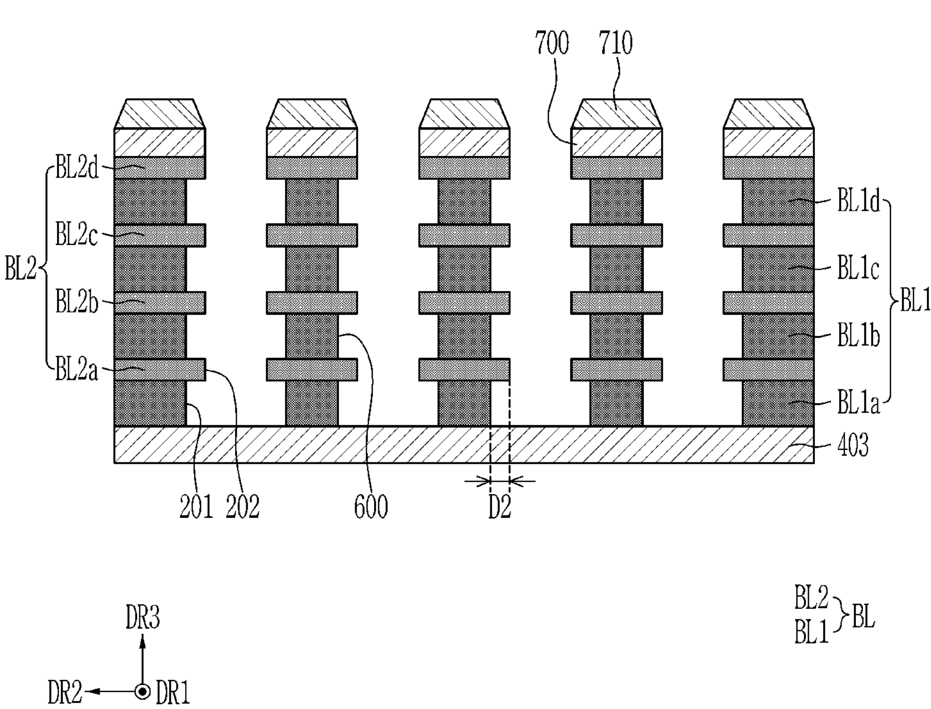

As shown in FIG. 12, the organic light blocking layers BL1*a*, BL1*b*, BL1*c*, and BL1*d* and the inorganic light blocking layers BL2*a*, BL2*b*, BL2*c*, and BL2*d* alternately stacked on each other multiple times with the hard mask 700 as a mask may be simultaneously etched to form the light blocking pattern BL including an opening 600. Here, the etching process may be a dry etching process.

The organic light blocking layer BL1 and the inorganic light blocking layer BL2 may be materials with different etch rates, and they may be etched with different etching degrees, for example, the organic light blocking layer BL1 may be further etched than the inorganic light blocking layer BL2 in the same etching process.

In the direction that is parallel to the second direction DR2 in parallel to the substrate, the organic light blocking layer BL1 may be further etched than the inorganic light blocking layer BL2 by a predetermined or selected distance D2 so the concave portion 201 may be formed in the surface of the organic light blocking layer BL1 forming the opening 600. Further, the inorganic light blocking layer BL2 may be relatively less etched than the organic light blocking layer BL1 to form the convex portion 202 on the surface forming the opening 600. In a cross-sectional view, the width of the concave portion 201 may be less than the width of the convex portion 202, and the width of the convex portion 202 may be greater than the width of the concave portion 201.

The surfaces of the respective organic light blocking layers BL1*a*, BL1*b*, BL1*c*, and BL1*d* exposed toward the opening 600 may be the surface of the concave portion 201. The surfaces of the respective inorganic light blocking layers BL2*a*, BL2*b*, BL2*c*, and BL2*d* exposed toward the opening 600 may be the surface of the convex portion 202. Accordingly, the surface of the light blocking pattern BL may form the structure of protrusions and depressions including the concave portion 201 and the convex portion 202.

Figure 13:
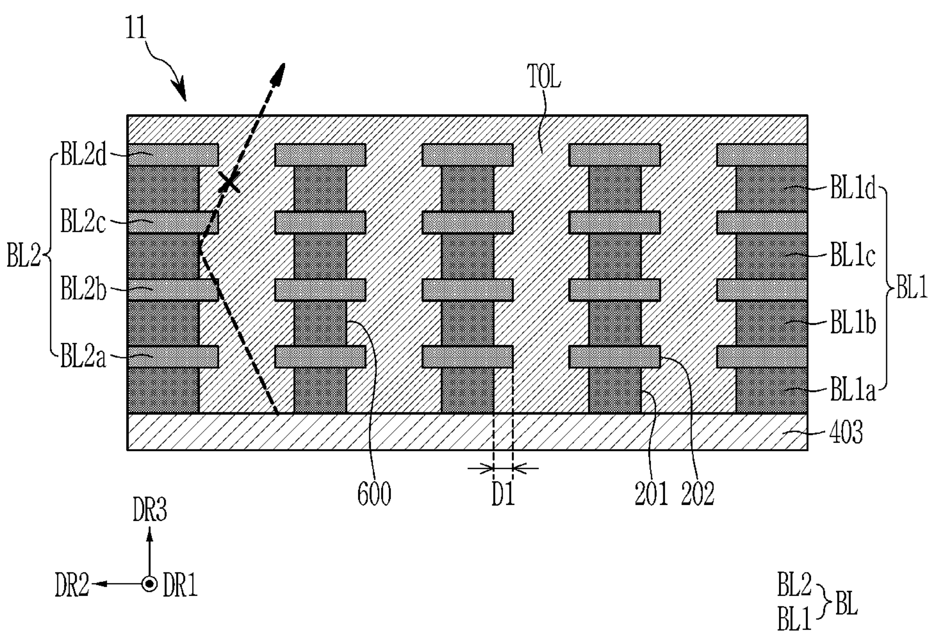

The hard mask 700 may be removed, and referring to FIG. 13, the transparent organic layer TOL may be applied to the entire region on the light blocking pattern BL. The transparent organic layer TOL applied to an entire region may be provided into the opening 600 among the light blocking pattern BL to fill the opening, and planarize the upper side of the light blocking pattern BL. Accordingly, no additional planarization process may be needed.

Figure 14:
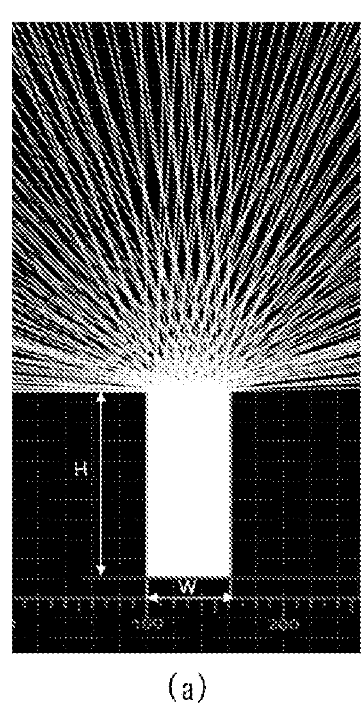
FIG. 14 is a schematic view of a simulation on reflection of a side wall according to a comparative example and an embodiment.
Figure 14:
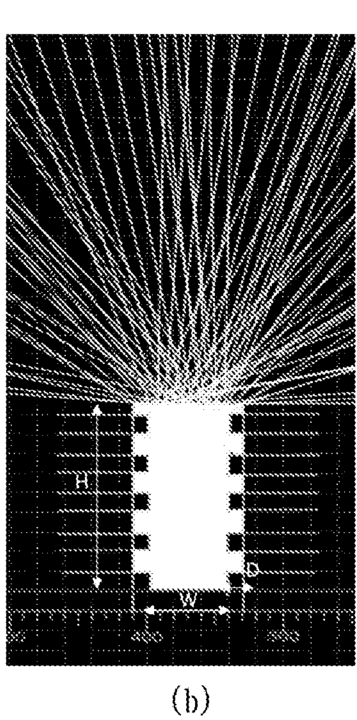

FIG. 14 is a schematic view of a simulation of light extracting degrees by light reflection on a side wall according to a comparative example and an embodiment.

FIG. 14(*a*) shows a comparative example in which no protrusions and depressions may be formed on the side wall of the light blocking pattern, a thickness H of the light blocking pattern may be 9 μm, a width W of the opening disposed between the light blocking pattern may be 3 μm, showing light extracting degrees. FIG. 14(*b*) shows an embodiment in which protrusions and depressions may be formed on the side wall of the light blocking pattern, the thickness H of the light blocking pattern may be 9 μm, the width W of the opening disposed between the light blocking pattern may be 3 μm, the width D of the protrusions and depressions may be 0.5 μm, showing the light extracting degrees.

It may be found that the light extracting degrees emitted to the outside according to an embodiment given with FIG. 14(*b*) may be further reduced than the comparative example of FIG. 14(*a*), and it may be found as an actual simulation result that the amount of extracted light according to an embodiment may be reduced by 60% compared to the amount of extracted light according to a comparative example.

For example, assuming that the side wall reflectance of the light blocking pattern is 100% in a comparative example, it may be found that the side wall reflectance of the light blocking pattern may be 40% according to an embodiment. As described, in case that the protrusions and depressions are formed on the side wall of the light blocking pattern, the light extracted to the outside may be reduced by 60% compared to the case in which they may not be formed thereon, thereby finding that the side wall reflectance of the light blocking pattern may be substantially reduced.

Figure 15:
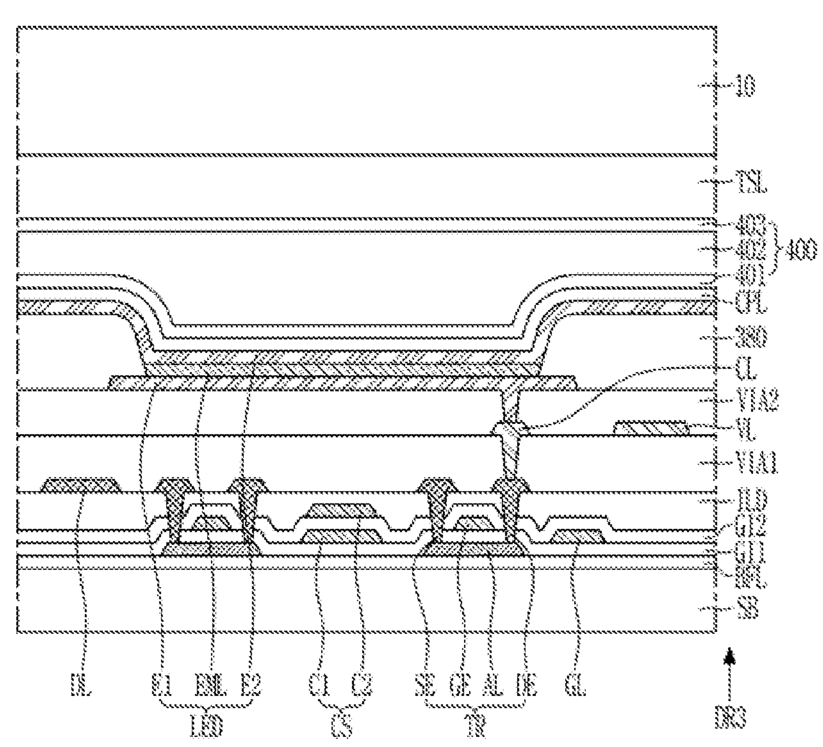
FIG. 15 is a schematic cross-sectional view of a display panel according to an embodiment.

A structure of a light-emitting device disposed at a lower portion of the light control layer 10 will now be described with reference to FIG. 15. FIG. 15 is a schematic cross-sectional view of a stacking structure of a display panel according to an embodiment.

The display panel may include a substrate SB, a transistor TR provided on the substrate SB, and a light-emitting device LED connected to the transistor TR. The light-emitting device LED may correspond to the pixel.

The substrate SB may be made of a material such as glass. The substrate SB may be a flexible substrate including a polymer resin such as a polyimide, a polyamide, and/or a polyethylene terephthalate.

A buffer layer BFL may be disposed on the substrate SB. The buffer layer BFL may block an impurity from the substrate SB and may improve a characteristic of a semiconductor layer in case that the semiconductor layer is formed, and it may planarize a surface of the substrate SB and may ease a stress of the semiconductor layer. The buffer layer BFL may include an inorganic insulating material such as a silicon nitride ($SiN_x$), a silicon oxide ($SiO_x$), and/or a silicon oxynitride ($SiO_xN_y$), and may be a single layer or a multilayer. The buffer layer BFL may include amorphous silicon (Si).

A semiconductor layer AL of the transistor TR may be disposed on the buffer layer BFL. The semiconductor layer AL may include a first region, a second region, and a channel region between the regions. The semiconductor layer AL may include at least one of amorphous silicon, polysilicon, and an oxide semiconductor. For example, the semiconductor layer AL may include a low temperature polysilicon (LTPS), or may include an oxide semiconductor material including at least one of zinc (Zn), indium (In), gallium (Ga), and tin (Sn). For example, the semiconductor layer AL may include an indium-gallium-zinc oxide (IGZO).

A first gate insulating layer GI1 may be disposed on the semiconductor layer AL. The first gate insulating layer GI1 may include an inorganic insulating material such as a silicon nitride, a silicon oxide, or a silicon oxynitride, and may be a single layer or a multilayer.

A first gate conductive layer including a gate electrode GE of the transistor TR, a gate line GL, and a first electrode C1 of a capacitor CS may be disposed on the first gate insulating layer GI1. The first gate conductive layer may include molybdenum (Mo), aluminum (Al), copper (Cu), and/or titanium (Ti), and may be a single layer or a multilayer.

A second gate insulating layer GI2 may be disposed on the first gate conductive layer. The second gate insulating layer GI2 may include an inorganic insulating material such as a silicon nitride, a silicon oxide, and/or a silicon oxynitride, and may be a single layer or a multilayer.

A second gate conductive layer including a second electrode C2 of the capacitor CS may be disposed on the second gate insulating layer GI2. The second gate conductive layer may include molybdenum (Mo), aluminum (Al), copper (Cu), and/or titanium (Ti), and may be a single layer or a multilayer.

An inter-layer insulating layer ILD may be disposed on the second gate insulating layer GI2 and the second gate conductive layer. The inter-layer insulating layer ILD may be an inorganic insulating material such as a silicon nitride, a silicon oxide, and/or a silicon oxynitride, and may be a single layer or a multilayer.

A first data conductive layer including a first electrode SE and a second electrode DE of the transistor TR, and a data line DL may be disposed on the inter-layer insulating layer ILD. The first electrode SE and the second electrode DE may be respectively connected to the first region and the second region of the semiconductor layer AL through contact holes of the insulating layers GI1, GI2, and ILD. One of the first electrode SE and the second electrode DE may be a source electrode and the other thereof may be a drain electrode. The first data conductive layer may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu), and may be a single layer or a multilayer.

A first planarization layer VIA1 may be disposed on the first data conductive layer. The first planarization layer VIA1 may be an organic insulating layer. For example, the first planarization layer VIA1 may include an organic insulating material such as a general-purpose polymer including poly (methyl methacrylate) and polystyrene, a polymer derivative having a phenol-based group, an acryl-based polymer, an imide-based polymer (e.g., a polyimide), and/or a siloxane-based polymer.

A second data conductive layer including a voltage line VL and a connection line CL may be disposed on the first planarization layer VIAL The voltage line VL may transmit voltages such as a driving voltage, a common voltage, an initialization voltage, or a reference voltage. The connection line CL may be connected to the second electrode DE of the transistor TR through a contact hole of the first planarization layer VIAL The second data conductive layer may include aluminum (Al), platinum (Pt), palladium (Pd), silver (Ag), magnesium (Mg), gold (Au), nickel (Ni), neodymium (Nd), iridium (Jr), chromium (Cr), nickel (Ni), calcium (Ca), molybdenum (Mo), titanium (Ti), tungsten (W), and/or copper (Cu), and may be a single layer or a multilayer.

A second planarization layer VIA2 may be disposed on the second data conductive layer. The second planarization layer VIA2 may be an organic insulating layer. For example, the second planarization layer VIA2 may include an organic insulating material such as a general-purpose polymer including poly(methyl methacrylate) and polystyrene, a polymer derivative having a phenol-based group, an acryl-based polymer, an imide-based polymer, a polyimide, and/or a siloxane-based polymer.

A first electrode E1 of the light-emitting device LED may be disposed on the second planarization layer VIA2. The first electrode E1 may be connected to the connection line CL through a contact hole of the second planarization layer VIA2. Therefore, the first electrode E1 may be electrically connected to the second electrode DE of the transistor TR and may receive a data signal for controlling luminance of the light-emitting device. The transistor TR connected to the first electrode E1 may be a driving transistor or a transistor electrically connected to the driving transistor. The first electrode E1 may be made of a reflective conductive material or a semi-transmissive conductive material, and may also be made of a transparent conductive material. The first electrode E1 may include a transparent conductive material such as an indium tin oxide (ITO) or an indium zinc oxide (IZO). The first electrode E1 may include a metal such as lithium (Li), calcium (Ca), aluminum (Al), silver (Ag), magnesium (Mg), gold (Au), or a metal alloy.

A pixel defining layer 380 that may be an organic insulating layer may be disposed on the second planarization layer VIA2. The pixel defining layer 380 may be referred to as a cell barrier, and may have an opening overlapping the first electrode E1. The pixel defining layer 380 may be a black pixel defining layer made of a black colored organic material and preventing light applied from the outside from being reflected to the outside, and it may be a transparent organic material depending on embodiments. Therefore, depending on embodiments, the pixel defining layer 380 may include a negative-type black organic material, and may include a black pigment.

An emission layer EML of the light-emitting device LED may be disposed on the first electrode E1. At least one of a hole injection layer, a hole transfer layer, an electron injection layer, and an electron transfer layer in addition to the emission layer EML may be disposed on the first electrode E1.

A second electrode E2 of the light-emitting device LED may be disposed on the emission layer EML. The second electrode E2 may be made a thin layer with a metal with a low work function such as calcium (Ca), barium (Ba), magnesium (Mg), aluminum (Al), silver (Ag), or a metal alloy thereof, thereby having light transmission. The second electrode E2 may include a transparent conductive oxide such as an indium tin oxide (ITO) or an indium zinc oxide (IZO).

The first electrode E1, the emission layer EML, and the second electrode E2 of each pixel may configure a light-emitting device LED such as an organic light emitting element. The first electrode E1 may be an anode of the light-emitting device, and the second electrode E2 may be a cathode of the light-emitting device.

A capping layer CPL may be disposed on the second electrode E2. The capping layer CPL may increase light efficiency by adjusting a refractive index. The capping layer CPL may entirely cover the second electrode E2. The capping layer CPL may include an organic insulating material, and may include an inorganic insulating material.

An encapsulation layer 400 may be disposed on the capping layer CPL. The encapsulation layer 400 may encapsulate the light-emitting device LED to prevent permeation of moisture or oxygen from the outside. The encapsulation layer 400 may be a thin film encapsulation layer including at least one of inorganic films 401 and 403 and at least one organic film 402.

A touch sensor layer TSL including touch electrodes may be disposed on the encapsulation layer 400. The touch electrodes may have a mesh shape having an opening overlapping the light-emitting device LED.

The light control layer 10 may be disposed on the touch sensor layer TSL. A cover window for protecting a front side of the display panel may be disposed on the light control layer 10.

A protection film for protecting the display panel may be disposed below the substrate SB. A functional sheet including at least one of a cushion layer, a heat radiation sheet, a light blocking sheet, a waterproof tape, and an electromagnetic blocking film may be disposed below the protection film.

The light emitted by the emission layer EML of the display panel may pass through the light control layer 10 and the cover window and may be visible to the user. In this instance, the light emitted upward or downward by more than a predetermined or selected angle with respect to a direction that is perpendicular to the cover window may be blocked by the light blocking patterns BL included by the light control layer 10. The light control layer 10 may include the structure of protrusions and depressions on the side wall, thereby increasing light reflectance on the lateral side. The light blocking pattern BL configuring the light control layer 10 may have numerous varied embodiments shown with FIG. 1 to FIG. 14.

Many effects of the display device including a light control layer according to an embodiment will now be described with reference to FIG. 16 to FIG. 18.

Figure 16:
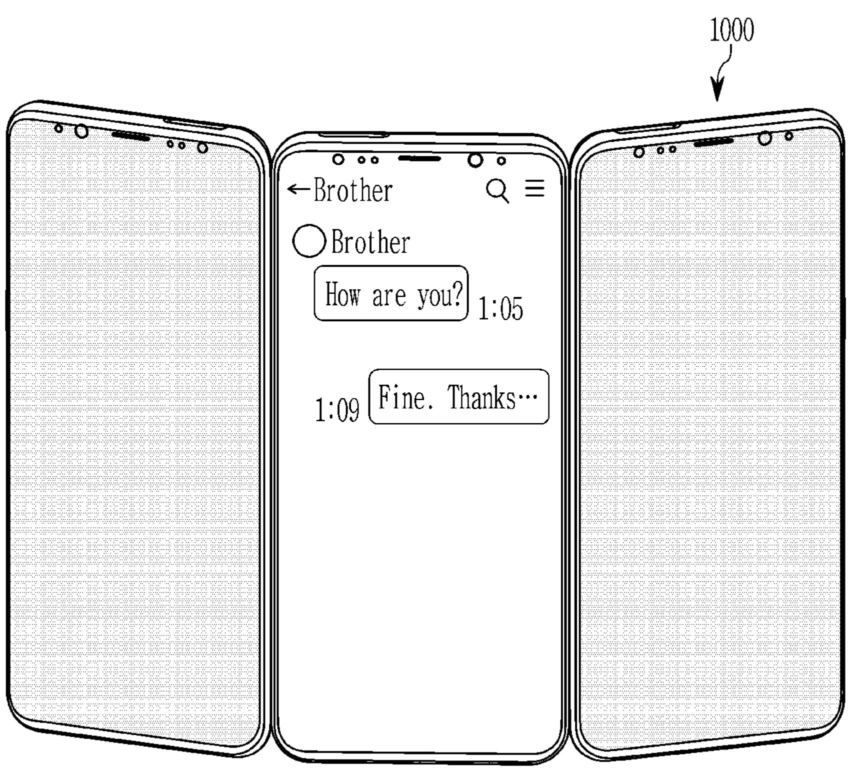
FIG. 16 is a schematic view of a display device seen from many angles according to an embodiment.

FIG. 16 is a schematic view of a display device seen from many angles according to an embodiment.

Referring to FIG. 16, the display device 1000 may display images to the user in a direction in which the user faces the display device 1000, and the images may not be seen to the user by greater than a predetermined or selected angle. According to this, it may provide a privacy function for protecting information displayed on the screen from others in public places.

Figure 17:
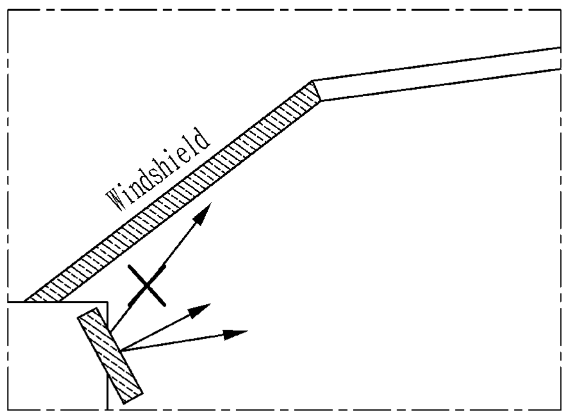
FIG. 17 is a schematic view of a light path emitted by a display device according to an embodiment.
Figure 18:
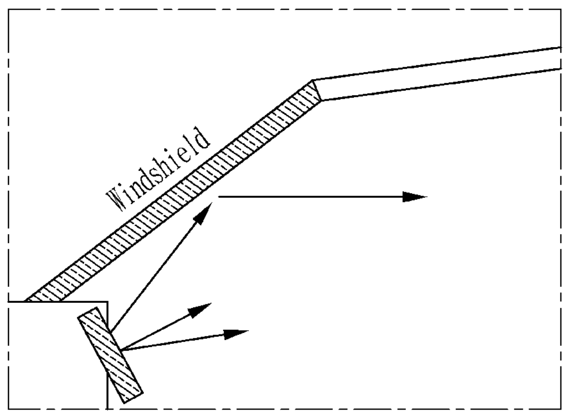
FIG. 18 is a schematic view of a light path emitted by a display device according to a comparative example.

FIG. 17 and FIG. 18 show cases in which a display device according to an embodiment is applied to a vehicle. FIG. 17 is a schematic view of a light path emitted by a display device according to an embodiment, and FIG. 18 is a schematic view of a light path emitted by a display device according to a comparative example.

As shown in FIG. 17, in the case of the display device including a light control layer, light emitted toward a vehicle windowpane (e.g., a windshield) may be blocked in the display device. Therefore, the light discharged from the display device may be prevented from being reflected at the vehicle windshield. The reflected images may not be generated and safety of the driver may be obtained by blocking the light going toward the vehicle windshield.

However, in case that the light control layer is not included, as shown in FIG. 18, the light emitted by the display device may be discharged by many angles and some of the light may be discharged toward the vehicle windshield and may be seen by the user as the reflected image.

While this disclosure has been described in connection with what is considered to be practical embodiments, it is to be understood that the disclosure is not limited to the disclosed embodiments, but, on the contrary, is intended to cover various modifications and equivalent arrangements included within the spirit and scope of the disclosure.

What is claimed is:

1. A display device, comprising:

a light-emitting device disposed on a substrate and including an emission layer; and a light control layer disposed on the light-emitting device, wherein the light control layer includes:

a plurality of light blocking patterns extending in a first direction and spaced apart from each other in a second direction intersecting the first direction, and a transmission layer disposed among the plurality of light blocking patterns and including a plurality of transparent organic layers and a plurality of transparent inorganic layers, ones of the plurality of transparent organic layers and ones of the plurality of transparent inorganic layers are alternately stacked on each other, and widths of each of the plurality of transparent organic layers in the second direction between neighboring ones of the plurality of light blocking patterns are equal to each other.

2. The display device of claim 1, wherein the transmission layer includes a plurality of protrusions and a plurality of depressions that include a plurality of concave portions and a plurality of convex portions, respectively, on a side extending to the light blocking pattern.

3. The display device of claim 2, wherein each of the plurality of transparent organic layers extend to the light blocking pattern at ones of the plurality of concave portions of the transmission layer, and each of the plurality of transparent inorganic layers extend to the light blocking pattern at the plurality of convex portions of the transmission layer.

4. The display device of claim 1, wherein a width of each of the plurality of transparent organic layers is different from a width of each of the plurality of transparent inorganic layers.

5. The display device of claim 4, wherein the width of each of the plurality of transparent organic layers is less than the width of each of the plurality of transparent inorganic layers.

6. The display device of claim 1, wherein each of the plurality of transparent organic layers have a greater etch rate than each of the plurality of transparent inorganic layers, and the light blocking pattern has a striped pattern in a plan view.

7. The display device of claim 6, wherein the transmission layer also has a striped pattern in a plan view, and the light blocking pattern and the transmission layer are alternately disposed in the second direction.

8. The display device of claim 1, wherein portions of each of the plurality of light blocking patterns do not overlap any of the plurality of transparent inorganic layers in a plan view.

9. The display device of claim 1, wherein each of the plurality of transparent inorganic layers have a width that extends in the second direction between neighboring ones of the plurality of light blocking patterns.

10. A method for manufacturing a display device, comprising:

forming a light-emitting device on a substrate;

forming an encapsulation layer that covers the light-emitting device;

forming a transparent material layer by alternately stacking a transparent organic layer and a transparent inorganic layer on each other on the encapsulation layer;

forming a hard mask pattern on the transparent material layer, etching the transparent material layer and forming a transmission pattern with the hard mask; and applying a light blocking material for filling an opening between the transmission pattern, wherein the transparent organic layer and the transparent inorganic layer are etched simultaneously to form the opening during the etching of the transparent material layer.

11. The method of claim 10, wherein the transmission pattern includes protrusions and depressions on a surface disposed toward the opening.

12. The method of claim 10, wherein a width of the transparent organic layer is less than a width of the transparent inorganic layer.

* * * * *